(12) United States Patent
Matsuzawa

(10) Patent No.: US 9,496,806 B2
(45) Date of Patent: Nov. 15, 2016

(54) MEMS DEVICE, ELECTRONIC APPARATUS, AND MANUFACTURING METHOD OF MEMS DEVICE

(71) Applicant: Seiko Epson Corporation, Tokyo (JP)

(72) Inventor: Yusuke Matsuzawa, Chino (JP)

(73) Assignee: Seiko Epson Corporation (JP)

( * ) Notice: Subject to any disclaimer, the term of this patent is extended or adjusted under 35 U.S.C. 154(b) by 533 days.

(21) Appl. No.: 13/953,092

(22) Filed: Jul. 29, 2013

(65) Prior Publication Data

US 2014/0035433 A1 Feb. 6, 2014

(30) Foreign Application Priority Data

Aug. 3, 2012 (JP) ................................. 2012-172611

(51) Int. Cl.
| | |
|---|---|
| H02N 1/00 | (2006.01) |
| B81B 7/00 | (2006.01) |
| B81C 1/00 | (2006.01) |
| B81B 3/00 | (2006.01) |

(52) U.S. Cl.
CPC ............. *H02N 1/006* (2013.01); *B81B 3/0086* (2013.01); *B81B 7/0006* (2013.01); *B81B 7/0032* (2013.01); *B81C 1/00* (2013.01); *B81B 2201/0271* (2013.01); *B81B 2203/04* (2013.01); *Y10T 29/49117* (2015.01)

(58) Field of Classification Search
CPC ........... H02N 1/00; H02N 1/006; H03B 5/30
USPC .................................. 310/300, 309; 331/156
See application file for complete search history.

(56) References Cited

U.S. PATENT DOCUMENTS

| | | | | |
|---|---|---|---|---|
| 7,459,827 | B2 * | 12/2008 | Kawakubo | ............ B81B 3/0021 310/309 |
| 2004/0135466 | A1 * | 7/2004 | Higuchi | ................. H02N 1/008 310/309 |
| 2004/0188783 | A1 * | 9/2004 | Funaki | .................. B81B 3/0021 257/415 |
| 2006/0125346 | A1 * | 6/2006 | Yoda | .................. G02B 26/0841 310/309 |
| 2006/0268383 | A1 * | 11/2006 | Cho | ........................ H02N 1/008 359/225.1 |
| 2008/0157627 | A1 * | 7/2008 | Kato | ..................... G02B 6/3566 310/309 |
| 2009/0302707 | A1 * | 12/2009 | Inaba | ................... H03H 3/0072 310/300 |
| 2011/0221536 | A1 * | 9/2011 | Inaba | ................... H03H 3/0072 331/156 |
| 2012/0134121 | A1 | 5/2012 | Kanemoto et al. | |
| 2012/0146736 | A1 * | 6/2012 | Kihara | .................. B81C 1/0015 331/156 |

FOREIGN PATENT DOCUMENTS

| | | |
|---|---|---|
| JP | 2009-051005 A | 3/2009 |
| JP | 2010-074173 A | 4/2010 |
| WO | WO-03012859 A1 | 2/2003 |

* cited by examiner

*Primary Examiner* — Thanh Lam
(74) *Attorney, Agent, or Firm* — Harness, Dickey & Pierce, P.L.C.

(57) ABSTRACT

A MEMS device is a MEMS device having a MEMS vibrator which includes a plurality of MEMS constituent elements laminated and formed above a first foundation portion which is laminated above a main surface of a wafer substrate, and the MEMS constituent elements are laminated above a first oxide film and a nitride film so as to cover an opening which is formed in the nitride film and exposes a second foundation portion above which the nitride film is laminated.

2 Claims, 8 Drawing Sheets

MEMS DEVICE, ELECTRONIC APPARATUS, AND MANUFACTURING METHOD OF MEMS DEVICE

BACKGROUND

1. Technical Field

The present invention relates to a MEMS device, an electronic apparatus, and a manufacturing method of the MEMS device.

2. Related Art

Generally, there is an electro-mechanical system structure having a structure which is called a micro-electro-mechanical system (MEMS) device, is formed using a micro-processing technique, and is mechanically movable. For example, JP-A-2009-51005 discloses a MEMS vibrator (a MEMS structure) which is formed along with a semiconductor device on a semiconductor substrate and includes a fixed electrode (a lower MEMS structure layer) and a movable electrode (an upper MEMS structure layer). The MEMS vibrator with this structure forms an electrostatic vibrator in which the movable electrode is vibrated by an electrostatic force of electric charge which is generated by an AC voltage applied between electrodes, and a resonance frequency signal unique to the vibrator is output between the electrodes.

Since the resonance frequency, the Q-value, or the like of the output signal depends on dimension accuracy of the MEMS structure which is an electrode, an MEMS vibrator with stable and excellent characteristics can be obtained using a micro-processing technique which has been used for semiconductor manufacturing.

However, recently, with the progress of further miniaturization of a MEMS device, there is a problem in that a stable characteristic cannot be obtained only with management of the dimension accuracy in a manufacturing process in the MEMS vibrator disclosed in JP-A-2009-51005. Specifically, the problem is that a positional relationship such as a gap between the fixed electrode and the movable electrode or an overlapping length thereof slightly changes due to a stress remaining or occurring in a foundation portion which is laminated on a semiconductor substrate and on which the MEMS vibrator including the fixed electrode and the movable electrode is formed, thereby changing the output characteristics of the MEMS vibrator.

SUMMARY

An advantage of some aspects of the invention is to solve at least a part of the problems described above, and the invention can be implemented as the following forms or application examples.

Application Example 1

This application example is directed to a MEMS device including a first foundation portion that is disposed on a substrate surface and has an opening; and MEMS constituent elements that are disposed on the first foundation portion, in which some of the MEMS constituent elements are connected to the substrate surface in the opening.

With this configuration, the MEMS device includes a plurality of MEMS constituent elements, and the MEMS constituent elements are laminated on the substrate surface and the first foundation portion so as to cover the opening which exposes the substrate surface on which the first foundation portion is laminated. Therefore, even in a case where there is a remaining stress in the first foundation portion, the first foundation portion expands or contracts due to a thermal stress, or the like, the MEMS constituent elements have the parts laminated on the substrate surface, and thus easy movement due to the stress of the first foundation portion disappears. In other words, the MEMS constituent elements have the parts which are not only laminated (floated) on the first foundation portion but are also laminated on the substrate surface which functions as an anchor, and thus movement due to the stress of the first foundation portion is restricted. As a result, when the MEMS device includes a plurality of MEMS constituent elements, a positional relationship therebetween does not easily change due to a stress of the first foundation portion, and thus predetermined characteristics of the MEMS device are maintained. Therefore, it is possible to provide a MEMS device with more stable characteristics.

Application Example 2

This application example is directed to the MEMS device according to the application example described above, which further includes a second foundation portion that is disposed between the substrate and the first foundation portion, in which the substrate surface is a surface which is located on the first foundation portion side of a surface of the second foundation portion.

With this configuration, the MEMS device includes a plurality of MEMS constituent elements, and the MEMS constituent elements are laminated on the second foundation portion and the first foundation portion so as to cover the opening which exposes the second foundation portion on which the first foundation portion is laminated. Therefore, even in a case where there is a remaining stress in the first foundation portion, the first foundation portion expands or contracts due to a thermal stress, or the like, the MEMS constituent elements have the parts laminated on the second foundation portion, and thus easy movement due to the stress of the first foundation portion disappears. In other words, the MEMS constituent elements have the parts which are not only laminated (floated) on the first foundation portion but are also laminated on the second foundation portion which functions as an anchor, and thus movement due to the stress of the first foundation portion is restricted. As a result, when the MEMS device includes a plurality of MEMS constituent elements, a positional relationship therebetween does not easily change due to a stress of the first foundation portion, and thus predetermined characteristics of the MEMS device are maintained. Therefore, it is possible to provide a MEMS device with more stable characteristics.

Application Example 3

This application example is directed to the MEMS device according to the application example described above, wherein the area of the opening in plan view of the substrate is in a range of 5% or more and 95% or less of the area of the MEMS constituent elements.

With this configuration, the area of the opening in plan view of the substrate is in a range of 5% or more and 95% or less of the area of the MEMS constituent elements. Even in the MEMS device including a plurality of MEMS constituent elements, all the elements of the MEMS constituent elements are not necessarily laminated on the second foundation portion in order to maintain a positional relationship therebetween. In a case where a positional relationship of a plurality of MEMS constituent elements is maintained in a predetermined part and a predetermined range, an anchor effect can be achieved in a predetermined range as long as the area of apart laminated on the second foundation portion which functions as an anchor is equal to or more than 5% of the area of the MEMS constituent elements. In addition, in a case where the first foundation portion is laminated on the second foundation portion in order not to expose the second foundation portion, if the area of the opening is equal to or less than 95% of the area of the MEMS constituent elements, it is possible to obtain a coverage sufficient to cover the entire opening with the MEMS constituent elements.

Application Example 4

This application example is directed to the MEMS device according to the application example described above, wherein the MEMS constituent elements include a fixed lower electrode and a movable upper electrode, and a region where the fixed lower electrode overlaps the movable upper electrode is provided in plan view of the substrate.

With this configuration, a MEMS structure is the MEMS vibrator which includes the fixed lower electrode and the movable upper electrode as MEMS constituent elements, and has the region where the fixed lower electrode overlaps the movable upper electrode in plan view of the substrate. In a case of the MEMS vibrator with this configuration, when a positional relationship between the fixed lower electrode and the movable upper electrode changes, the resonance frequency characteristic of the MEMS vibrator changes. Therefore, as in this case, the fixed lower electrode and the movable upper electrode have the parts which are not only laminated (floated) on the first foundation portion but are also laminated on the second foundation portion which functions as an anchor, and thus movement due to the stress of the first foundation portion is restricted. As a result, a positional relationship between the fixed lower electrode and the movable upper electrode does not easily change due to a stress of the first foundation portion, and thus the resonance frequency characteristic of the MEMS vibrator is maintained. Therefore, a MEMS vibrator which is a MEMS structure with more stable characteristics can be obtained, and thus it is possible to provide a MEMS device with more stable characteristics.

Application Example 5

This application example is directed to the MEMS device according to the application example described above, wherein the opening is formed at least around the region where the fixed lower electrode overlaps the movable upper electrode in plan view of the substrate.

As in the configuration described above, the opening is preferably formed in a region of the first foundation portion surrounding the region where the fixed lower electrode overlaps the movable upper electrode in plan view of the substrate. Since the part which functions as an anchor is formed in the area surrounding the region where the fixed lower electrode overlaps the movable upper electrode, positional changing of the region where the fixed lower electrode overlaps the movable upper electrode is suppressed more effectively, and thus changing in the resonance frequency characteristic of the MEMS vibrator can be suppressed more effectively.

Application Example 6

This application example is directed to the MEMS device according to the application example described above, wherein the opening is formed at least around a region where the fixed lower electrode, the movable upper electrode, and the first foundation portion overlap each other in plan view of the substrate.

As in the configuration described above, the opening is preferably formed at least in a region of the first foundation portion which overlaps the region where the fixed lower electrode overlaps the movable upper electrode in plan view of the substrate. In other words, since the opening can suppress positional changing of the fixed lower electrode of the region where the fixed lower electrode overlaps the movable upper electrode, and thus changing in the resonance frequency characteristic of the MEMS vibrator can be suppressed more effectively.

Application Example 7

This application example is directed to a MEMS device including a fixed lower electrode that is disposed on a substrate; a movable upper electrode that has a region which overlaps the fixed lower electrode in plan view of the substrate; a lower electrode wire portion that is disposed on the substrate and electrically connects the fixed lower electrode to an external circuit; and an upper electrode wire portion that is disposed on the substrate and electrically connects the movable upper electrode to the external circuit, in which the lower electrode wire portion and the upper electrode wire portion have curved sections in an extending direction thereof.

With this configuration, the MEMS device includes the fixed lower electrode which is laminated and is formed on the first foundation portion laminated on the main surface of the substrate; the movable upper electrode having a region which overlaps the fixed lower electrode in plan view of the substrate; the lower electrode wire portion and the upper electrode wire portions respectively connecting the electrodes to an external circuit, in which the respective wire portions have curved sections in the extending direction thereof. For this reason, even in a case where there is a remaining stress in the first foundation portion on which the respective wire portions are laminated, the first foundation portion expands or contracts due to a thermal stress, or the like, this stress is absorbed by the curved sections of the wires, and thus a ratio thereof acting on the fixed lower electrode or the movable upper electrode is reduced. In other words, the stress of the first foundation portion is alleviated which changes a positional relationship between the fixed lower electrode and the movable upper electrode. As a result, the resonance frequency characteristic of the MEMS vibrator is suppressed from changing. Therefore, a MEMS vibrator which is a MEMS structure with more stable characteristics can be obtained, and thus it is possible to provide a MEMS device with more stable characteristics.

Application Example 8

This application example is directed to a MEMS device including a fixed lower electrode that is disposed on a substrate; a movable upper electrode that has a region which overlaps the fixed lower electrode in plan view of the substrate; a lower electrode wire portion that is disposed on the substrate and electrically connects the fixed lower electrode to an external circuit; and an upper electrode wire portion that is disposed on the substrate and electrically connects the movable upper electrode to the external circuit, in which the lower electrode wire portion and the upper electrode wire portion have notch sections in a direction intersecting an extending direction thereof.

With this configuration, the MEMS device includes the fixed lower electrode which is laminated and is formed on the first foundation portion laminated on the main surface of the substrate; the movable upper electrode having a region which overlaps the fixed lower electrode in plan view of the substrate; the lower electrode wire portion and the upper electrode wire portions respectively connecting the electrodes to an external circuit, in which the respective wire portions have notch sections formed in the direction intersecting the extending direction thereof. For this reason, even in a case where there is a remaining stress in the first foundation portion on which the respective wire portions are laminated, the first foundation portion expands or contacts due to a thermal stress, or the like, this stress is absorbed by the formed notch sections, and thus a ratio thereof acting on the fixed lower electrode or the movable upper electrode is reduced. In other words, the stress of the first foundation portion is alleviated which changes a positional relationship between the fixed lower electrode and the movable upper electrode. As a result, the resonance frequency characteristic of the MEMS vibrator is suppressed from changing. Therefore, a MEMS vibrator which is a MEMS structure with more stable characteristics can be obtained, and thus it is possible to provide a MEMS device with more stable characteristics.

Application Example 9

This application example is directed to an electronic apparatus including the MEMS device according to Application Example 8.

With this configuration, it is possible to provide an electronic apparatus with more stable predetermined characteristics.

Application Example 10

This application example is directed to a manufacturing method of a MEMS device including preparing a substrate provided with a second foundation portion on a main surface thereof; disposing a first foundation portion on the second foundation portion; forming an opening which exposes the second foundation portion in the first foundation portion; and forming MEMS constituent elements on the second foundation portion and the first foundation portion so as to cover the opening.

With this configuration, the MEMS device includes a plurality of MEMS constituent elements, and the MEMS constituent elements are laminated on the second foundation portion and the first foundation portion so as to cover the opening which exposes the second foundation portion on which the first foundation portion is laminated. Therefore, even in a case where there is a remaining stress in the first foundation portion, the first foundation portion expands or contracts due to a thermal stress, or the like, the MEMS constituent elements have the parts laminated on the second foundation portion, and thus easy movement due to the stress of the first foundation portion disappears. In other words, the MEMS constituent elements have the parts which are not only laminated (floated) on the first foundation portion but are also laminated on the second foundation portion which functions as an anchor, and thus movement due to the stress of the first foundation portion is restricted. As a result, when the MEMS device includes a plurality of MEMS constituent elements, a positional relationship therebetween does not easily change due to a stress of the first foundation portion, and thus predetermined characteristics of the MEMS device are maintained. Therefore, it is possible to provide a MEMS device with more stable characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail with reference to the drawings. The following is an embodiment of the invention and is not intended to limit the invention. In addition, in the following respective drawings, for better understanding of description, scales different from actual ones are shown in some cases.

Embodiment 1

Figure 1A:
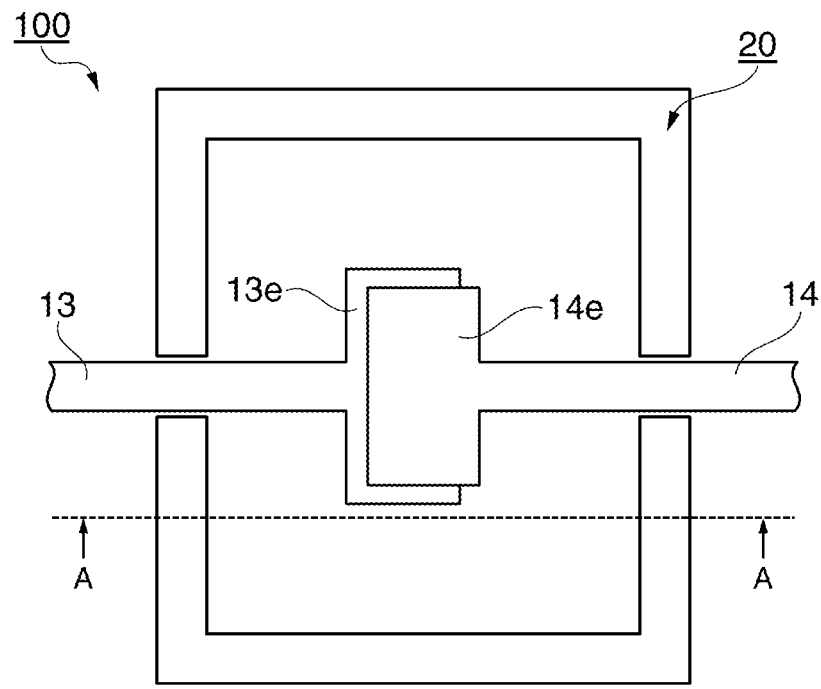
FIG. 1A is a plan view of a MEMS device according to Embodiment 1.
Figure 1B:
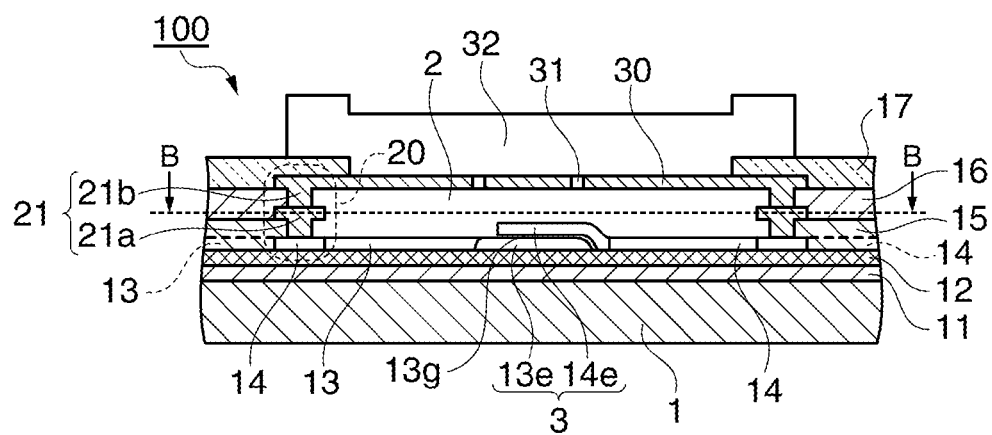
FIG. 1B is a cross-sectional view taken along the line A-A.

FIG. 1A is a plan view of a MEMS device 100 according to Embodiment 1, and FIG. 1B is a cross-sectional view taken along the line A-A of FIG. 1A. In addition, FIG. 1A is a plan view taken along the line B-B of FIG. 1B.

A MEMS device 100 is a MEMS device having a MEMS vibrator which is a MEMS structure disposed in a cavity portion which is formed by etching a sacrificial layer laminated on a main surface of a wafer substrate.

The MEMS device 100 includes a wafer substrate 1, a cavity portion 2, a MEMS vibrator 3, a first oxide film 11 which is a second foundation portion, a nitride film 12 which is a first foundation portion, a first semiconductor layer 13, a second semiconductor layer 14, a second oxide film 15, a third oxide film 16, a protective film 17, a sidewall portion 20, a wire layer 21, a first coat layer 30, an etching hole 31, a second coat layer 32, and the like.

The wafer substrate 1 is a silicon substrate, and the MEMS vibrator 3 is formed on the first oxide film 11 and the nitride film 12 which are foundation layers laminated on the wafer substrate 1.

In addition, here, the description is made assuming that a direction in which the first oxide film 11 and the nitride film 12 are sequentially laminated on the main surface of the wafer substrate 1 is an upper direction.

The MEMS vibrator 3 includes a fixed lower electrode (a lower electrode 13e) and a movable upper electrode (an upper electrode 14e) having a movable portion, as MEMS constituent elements, and is disposed in the cavity portion 2. The lower electrode 13e and the upper electrode 14e are formed by patterning the first semiconductor layer 13 and the second semiconductor layer 14 laminated on the first oxide film 11 and the nitride film 12, by using photolithography. The first semiconductor layer 13 and the second semiconductor layer 14 are respectively made of conductive polysilicon as a preferred example, and are not limited thereto. A gap (a vacant space 13g) forming a movable space of the upper electrode 14e is formed between the lower electrode 13e and the upper electrode 14e. The cavity portion 2 and the vacant space 13g are formed by removing (release-etching) the second oxide film 15 and the third oxide film 16 laminated on the MEMS vibrator 3, and a fourth oxide film 13f (shown in FIG. 3C described later) formed between the lower electrode 13e and the upper electrode 14e through etching. The second oxide film 15, the third oxide film 16, and the fourth oxide film 13f are so-called sacrificial layers, and the sacrificial layers are release-etched so as to form a movable electrode structure (MEMS structure) of a cantilever structure in which the upper electrode 14e is isolated from the lower electrode 13e.

Figure 2A:
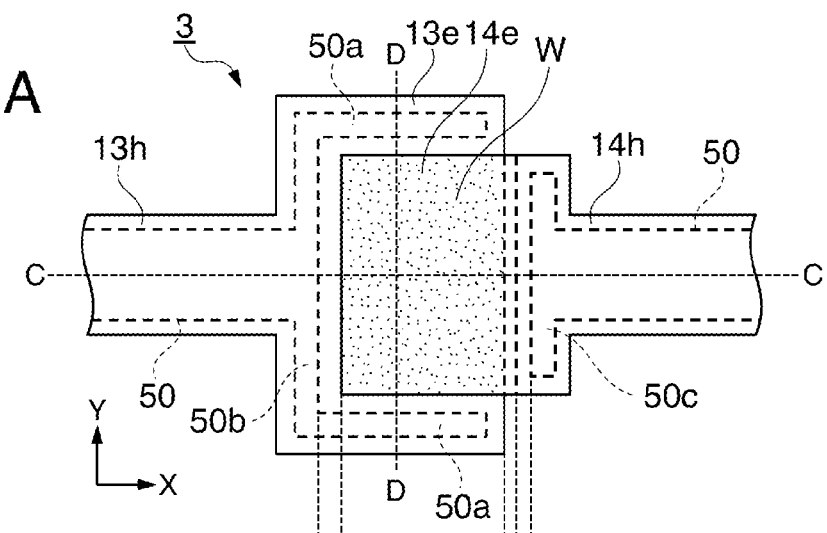
FIG. 2A is a plan view of a MEMS vibrator according to Embodiment 1.
Figure 2B:
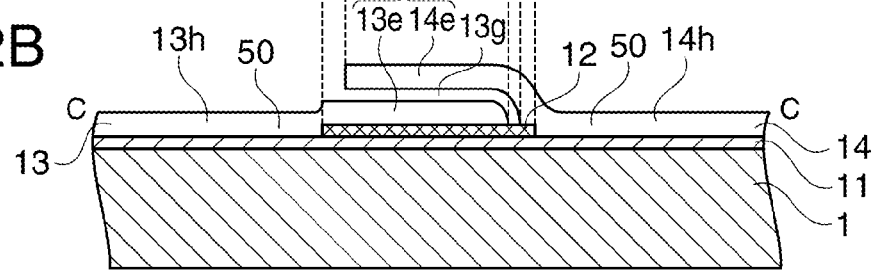
FIG. 2B is a cross-sectional view taken along the line C-C.
Figure 2C:
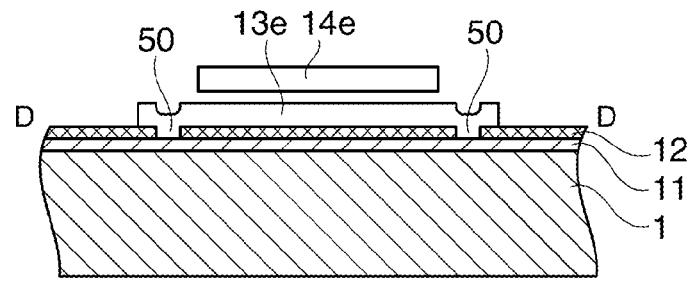
FIG. 2C is a cross-sectional view taken along the line D-D.

FIG. 2A is a plan view of the MEMS vibrator 3, FIG. 2B is a cross-sectional view taken along the line C-C of FIG. 2A, and FIG. 2C is a cross-sectional view taken along the line D-D of FIG. 2A.

The MEMS vibrator 3 includes the lower electrode 13e, the upper electrode 14e, a lower electrode wire portion 13h, an upper electrode wire portion 14h, and the like, as MEMS constituent elements.

The lower electrode 13e has the width (the width which is large in the Y direction of the upper electrode 14e in FIG. 2A) larger than the upper electrode 14e. The upper electrode 14e is formed so as to cover the lower electrode 13e via the vacant space 13g, and there is a region W where the lower electrode 13e overlaps the upper electrode 14e in plan view of the wafer substrate 1.

The lower electrode 13e is electrically connected to an external circuit (not shown) by the lower electrode wire portion 13h. The lower electrode 13e and the lower electrode wire portion 13h are integrally formed by patterning the laminated first semiconductor layer 13 through photolithography.

In addition, the upper electrode 14e is electrically connected to the external circuit by the upper electrode wire portion 14h. The upper electrode 14e and the upper electrode wire portion 14h are integrally formed by patterning the laminated second semiconductor layer 14 through photolithography.

The lower electrode 13e, the lower electrode wire portion 13h, the upper electrode 14e, and the upper electrode wire portion 14h are laminated so as to cover openings 50 formed in the nitride film 12 which is the first foundation portion. In other words, the openings 50 are formed through patterning using photolithography before the first semiconductor layer 13 and the second semiconductor layer 14 are laminated.

The openings 50 are open regions formed in the nitride film 12 such that, when the first semiconductor layer 13 and the second semiconductor layer 14 are laminated, each partial region thereof is directly tightly close to the first oxide film 11. The openings 50 are at least formed in regions surrounding the region W where the lower electrode 13e overlaps the upper electrode 14e in plan view of the wafer substrate 1. Specifically, as shown in FIG. 2A, the openings 50 are formed in two sides (regions 50a) where the lower electrode 13e is formed so as to be longer than the upper electrode 14e in the Y direction, and two sides (one side thereof is a side (region 50b) connected to the lower electrode wire portion 13h of the lower electrode 13e, and the other side is a side (region 50c) connected to the upper electrode wire portion 14h of the upper electrode 14e in the fixed portion supported in a cantilever state) intersecting the two side. In addition, the openings 50 are also formed under the extending lower electrode wire portion 13h and upper electrode wire portion 14h.

The area of the openings 50 in plan view of the wafer substrate 1 is at least 5% or more of the area of the lower electrode 13e and the upper electrode 14e in the regions of the lower electrode 13e and the upper electrode 14e. In addition, the first semiconductor layer 13 and the second semiconductor layer 14 are patterned so as to reliably cover the openings 50 such that the first oxide film 11 is not exposed in the openings 50. This is aimed at preventing the first oxide film 11 from being etched in release-etching described later. For this reason, the area of the openings 50 is equal to or less than 95% of the total area of the lower electrode 13e, the upper electrode 14e, the lower electrode wire portion 13h, and the upper electrode wire portion 14h as the area in plan view of the MEMS constituent elements.

Next, a manufacturing method of the MEMS device 100 will be described.

FIGS. 3A to 3G are process diagrams illustrating a manufacturing method of the MEMS device 100 in order.

A manufacturing method of the MEMS device 100 includes a step of laminating the first foundation portion (the nitride film 12) on the main surface of the wafer substrate 1; a step of forming the openings 50 which expose the second foundation portion (the first oxide film 11) on which the nitride film 12 is laminated, in the nitride film 12; a step of laminating the first semiconductor layer 13 and the second semiconductor layer 14 as MEMS constituent layers on the first oxide film 11 and the nitride film 12 so as to cover the openings 50; a step of patterning the first semiconductor layer 13 and the second semiconductor layer 14 so as to form the lower electrode 13e, the upper electrode 14e, the lower electrode wire portion 13h, and the upper electrode wire portion 14h as MEMS constituent elements including regions covering the openings 50 of the first semiconductor layer 13 and the second semiconductor layer 14; and a step of etching the sacrificial layers so as to form the MEMS vibrator 3.

Hereinafter, detailed description will be made with reference to the drawings.

Figure 3A:
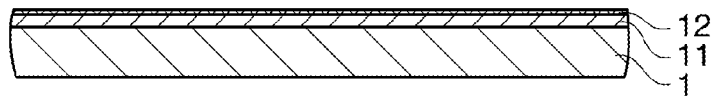
FIGS. 3A to 3G are process diagrams illustrating a manufacturing method of the MEMS device according to Embodiment 1.

FIG. 3A: The wafer substrate 1 is prepared, and the second foundation portion (the first oxide film 11) is laminated on the main surface. The first oxide film 11 is formed of a normal local oxidation of silicon (LOCOS) oxide film which is an element isolation layer in a semiconductor process as a preferred example, but may be an oxide film formed using, for example, a shallow trench isolation (STI) method depending on the generation of the semiconductor process.

Next, the first foundation portion (the nitride film 12) is laminated. The nitride film 12 is resistant to a buffered hydrofluoric acid which is an etchant used when sacrificial layers are release-etched, and thus functions as an etching stopper.

Figure 3B:
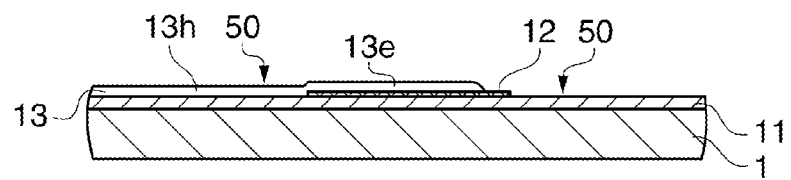

FIG. 3B: The nitride film 12 is patterned through photolithography so as to form the openings 50 which expose the first oxide film 11.

Next, the first semiconductor layer 13 is laminated on the first oxide film 11 and the nitride film 12. The first semiconductor layer 13 is a polysilicon layer forming the lower electrode 13e and the lower electrode wire portion 13h, and is made to have a predetermined conductivity by implanting ions thereinto after being laminated.

Next, the first semiconductor layer 13 is patterned through photolithography so as to form the lower electrode 13e and the lower electrode wire portion 13h while covering the openings 50.

Figure 3C:
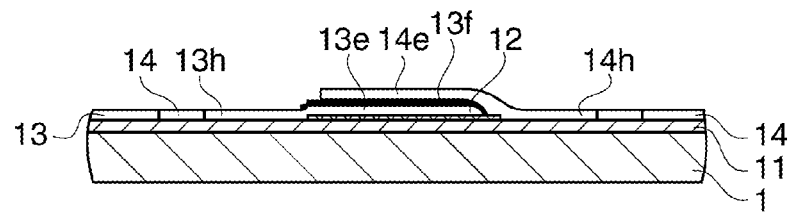

FIG. 3C: The lower electrode 13e is thermally oxidized so as to form the fourth oxide film 13f. To form the oxide film using the thermal oxidization is selectively performed on the first semiconductor layer 13 (polysilicon layer). The fourth oxide film 13f forms a gap between the lower electrode 13e and the upper electrode 14e which are sacrificial layers. In addition, the fourth oxide film 13f may be an oxide film formed using chemical vapor deposition (CVD).

Next, the second semiconductor layer 14 is laminated. The second semiconductor layer 14 is a polysilicon layer forming the upper electrode 14e, the upper electrode wire portion 14h, and lowermost layer of the sidewall portion 20 (FIGS. 1A and 1B). The second semiconductor layer 14 is patterned through photolithography so as to form the upper electrode 14e, the upper electrode wire portion 14h, and the lowermost layer of the sidewall portion 20 while covering the openings 50.

Ions are implanted into the second semiconductor layer 14 forming the upper electrode 14e and the upper electrode wire portion 14h after being laminated so as to have a predetermined conductivity.

Figure 3D:
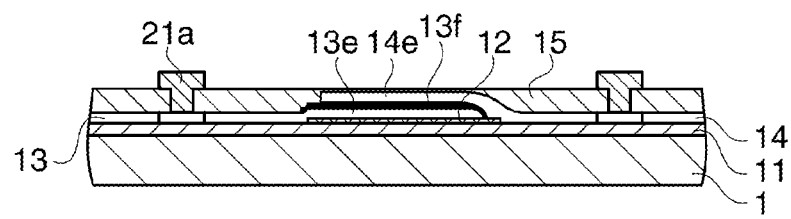

FIG. 3D: The second oxide film 15 forming a sacrificial layer is laminated. The second oxide film 15 is formed as an interlayer film (inter-metal dielectric (IMD)) in a semiconductor process, and is planarized using tetraethoxysilane (TEOS) as a preferred example. The planarization may be performed using chemical mechanical polishing (CMP) depending on the generation of a semiconductor process.

Next, before a first wire layer 21a is laminated, an exposure portion (hole) for electrical connection between the first wire layer 21a and the second semiconductor layer is formed in the second oxide film 15 through photolithography. Successively, the first wire layer 21a is laminated and is patterned through photolithography. Aluminum is laminated in the first wire layer 21a through sputtering as a preferred example.

Figure 3E:
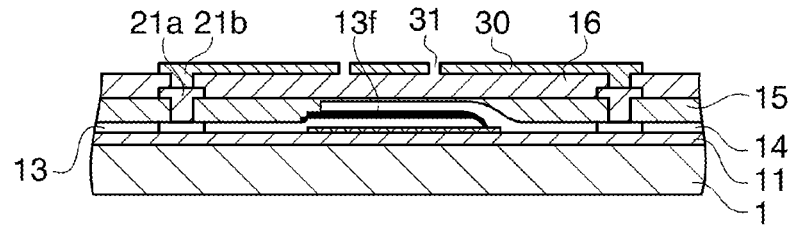
Figure 3F:
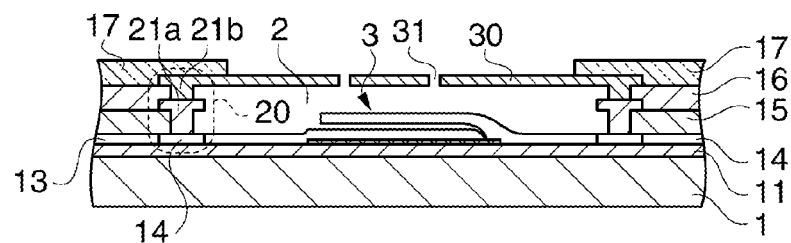

In addition, since electrical circuits are not shown, the first wire layer 21a is shown only in a part forming the sidewall portion 20 (FIG. 3F).

FIG. 3E: The third oxide film 16 is laminated as the second layer forming sacrificial layers. The third oxide film 16 is formed as an interlayer film (Inter Layer Dielectrics (ILD)) in a semiconductor process, and may be planarized using CMP or the like depending on the generation of a semiconductor process.

Next, before a second wire layer 21b is laminated, an exposure portion (hole) for electrical connection between the first wire layer 21a and the second wire layer 21b is formed in the third oxide film 16 through photolithography.

Next, the second wire layer 21b is laminated and is patterned through photolithography. The second wire layer 21b forms the uppermost layer of the sidewall portion 20, has the etching hole 31 for release-etching the sacrificial layers of the MEMS device 100, and covers the sacrificial layer (the third oxide film 16). In other words, the second wire layer 21b forms the first coat layer 30.

In addition, aluminum is laminated in the second wire layer 21b through sputtering as a preferred example.

FIG. 3F: The protective film 17 is laminated, and is patterned through photolithography so as to form an opening region which exposes the etching hole 31. The protective film 17 may be a normal protective film (for example, a $SiO_2$ film or a two-layer film of SiN) in a semiconductor process, a polyimide film, or the like.

Next, the wafer substrate 1 is exposed to an etchant so as to release-etch the second oxide film 15, the third oxide film 16, and the fourth oxide film 13f which are sacrificial layers with the etchant introduced from the etching hole 31, thereby forming the MEMS vibrator 3 which is a MEMS structure.

In addition, the first oxide film 11 temporarily exposed by the openings 50 in the step shown in FIG. 3B is not here exposed to the etchant because of being covered by the first semiconductor layer 13 and the second semiconductor layer 14.

Figure 3G:
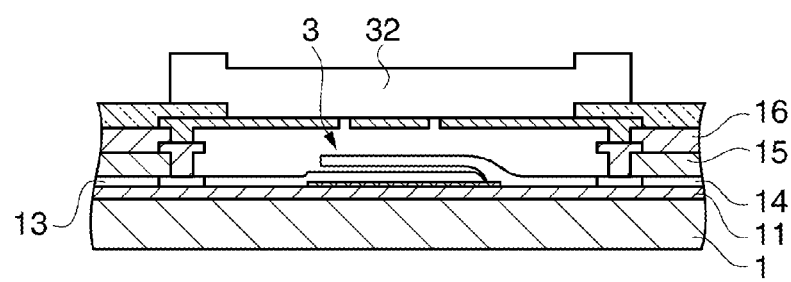

FIG. 3G: After the release-etching finishes and cleaning is performed, the second coat layer 32 is laminated, and is patterned through photolithography such that a part which is not covered by the protective film 17 is sealed. The etching hole 31 is sealed by the second coat layer 32, and the space from which the sacrificial layers are removed through the release-etching is maintained in an airtight state. The second coat layer 32 uses aluminum as a preferred example, but is not limited thereto and may use other metals.

As described above, the following effects can be achieved according to the MEMS device and the manufacturing method of the MEMS device of the present embodiment.

The MEMS device 100 includes the lower electrode 13e, the upper electrode 14e, the lower electrode wire portion 13h, and the upper electrode wire portion 14h as a plurality of MEMS constituent elements, and the MEMS constituent elements are laminated on the first oxide film 11 and the nitride film 12 so as to cover the openings 50 which expose the second foundation portion (the first oxide film 11) on which the first foundation portion (the nitride film 12) is laminated. Therefore, even in a case where there is a remaining stress in the nitride film 12, the nitride film 12 expands or contracts due to a thermal stress, or the like, the MEMS constituent elements (particularly, the lower electrode 13e and the upper electrode 14e) have the parts laminated on the first oxide film 11, and thus easy movement due to the stress of the nitride film 12 disappears. In other words, the lower electrode 13e and the upper electrode 14e have the parts which are not only laminated (floated) on the nitride film 12 but are also laminated on the first oxide film 11 which functions as an anchor, and thus movement due to the stress of the nitride film 12 is restricted. As a result, a positional relationship between the lower electrode 13e and the upper electrode 14e does not easily change due to a stress of the nitride film 12, and thus the resonance frequency characteristic of the MEMS vibrator 3, and further predetermined characteristics of the MEMS device 100 are maintained. Therefore, it is possible to provide a MEMS device with more stable characteristics. In addition, even if the lower electrode 13e and the upper electrode 14e have parts which are not only laminated on the first oxide film 11 but also on the wafer substrate 1, the parts can function as an anchor in the same manner as described. In other words, the lower electrode 13e and the upper electrode 14e may have parts which are not only laminated (floated) on the nitride film 12 but are also laminated on the wafer substrate face (for example, the first oxide film 11 or the wafer substrate 1).

In addition, the area of the openings 50 in plan view of the wafer substrate 1 is 5% or more and 95% or less of the area of the MEMS constituent elements, that is, the total area of the lower electrode 13e, the upper electrode 14e, the lower electrode wire portion 13h, and the upper electrode wire portion 14h in plan view. The openings 50 are formed so as to have the area which is equal to or more than at least 5% of the area of the MEMS constituent elements, and thus it is possible to achieve a more effective function as an anchor.

In addition, in a case where the nitride film 12 is laminated on the first oxide film 11 in order not to expose the first oxide film 11, if the area of the openings 50 is equal to or less than 95% of the area of the MEMS constituent elements, it is possible to obtain a coverage sufficient to cover the entire openings 50 with the first semiconductor layer 13 and the second semiconductor layer 14 forming the MEMS constituent elements.

In addition, the openings 50 are formed in the region of the nitride film 12 surrounding the region W where the lower electrode 13e overlaps the upper electrode 14e in plan view of the wafer substrate 1. Since the part which functions as an anchor is formed in the area surrounding the region W, positional changing of the region W is suppressed more effectively, and thus changing in the resonance frequency characteristic of the MEMS vibrator 3 can be suppressed more effectively.

Embodiment 2

Next, a MEMS device 101 according to Embodiment 2 will be described. In addition, in the following description, the same constituent element as in the above-described embodiment is given the same reference numeral, and repeated description will be omitted.

Figure 4A:
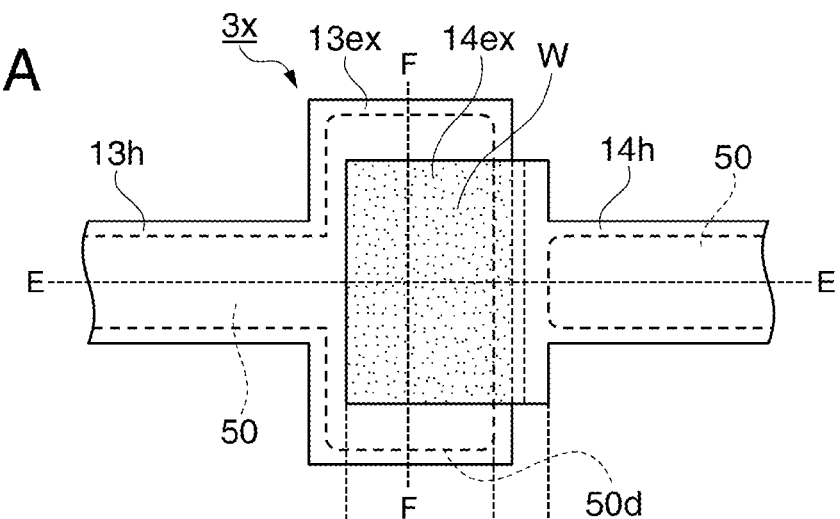
FIG. 4A is a plan view of a MEMS vibrator according to Embodiment 2.
Figure 4B:
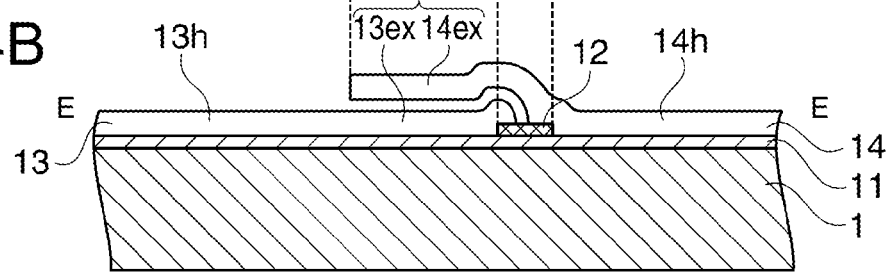
FIG. 4B is a cross-sectional view taken along the line E-E.
Figure 4C:
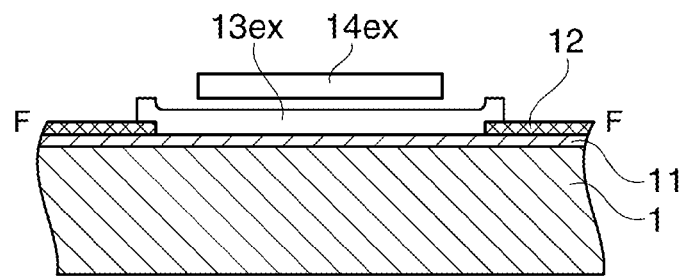
FIG. 4C is a cross-sectional view taken along the line F-F.

FIG. 4A is a plan view of a MEMS vibrator 3x included in the MEMS device 101 (not shown), FIG. 4B is a cross-sectional view taken along the line E-E of FIG. 4A, and FIG. 4C is a cross-sectional view taken along the line F-F of FIG. 4A.

Embodiment 2 has a feature in which the opening 50 is formed in a region of the first foundation portion (the nitride film 12) which overlaps the region W where the lower electrode 13e overlaps the upper electrode 14e in plan view of the wafer substrate 1.

The MEMS vibrator 3x includes a fixed lower electrode (a lower electrode 13ex) and a movable upper electrode (an upper electrode 14ex) having a movable portion as MEMS constituent elements.

The present embodiment is different from Embodiment 1 in terms of a position and a shape of the opening 50. In other words, a position and a shape which function as an anchor are different. Furthermore, as a result of the aforementioned reason, cross-sectional shapes of the lower electrode 13ex and the upper electrode 14ex are different. The present embodiment is the same as Embodiment 1 except for these matters.

As shown in FIG. 4A, the opening 50 is formed in a region 50d of the region of the lower electrode 13ex instead of the opening 50 (the regions 50a to 50c) in a case of the MEMS vibrator 3. The region 50d is formed in an approximately entire part (a range taking up about 85% of the area of the lower electrode 13ex) of the region of the nitride film 12 which overlaps the lower electrode 13ex in plan view of the wafer substrate 1.

Since an opening of the nitride film 12 is formed in the region 50d which is the opening 50, that is, in the part overlapping the region W, the shape of the step difference of the nitride film 12 is reflected on cross-sectional shapes of the lower electrode 13ex and the upper electrode 14ex as shown in FIG. 4B.

In addition, in the present embodiment, the opening 50 is omitted which is formed in the region 50c in the upper electrode 14e of Embodiment 1. The opening 50 is omitted since the region 50d is formed at a position close to the opening 50 formed under the upper electrode wire portion 14h and thus an anchor effect is sufficient. Therefore, the opening 50 may be formed in the region 50c in the same manner as in Embodiment 1.

According to the MEMS device of the present embodiment, the opening 50 is formed in the region 50d of the first foundation portion (the nitride film 12) which overlaps the region W where the lower electrode 13ex overlaps the upper electrode 14ex in plan view of the wafer substrate 1. In other words, since positional changing of the lower electrode 13ex can be directly suppressed using the anchor function of the opening 50 in the region 50d, it is possible to more effectively suppress changing in the resonance frequency characteristic of the MEMS vibrator.

Embodiment 3

Next, a MEMS device 102 according to Embodiment 3 will be described. In addition, in the following description, the same constituent element as in the above-described embodiment is given the same reference numeral, and repeated description will be omitted.

Figure 5A:
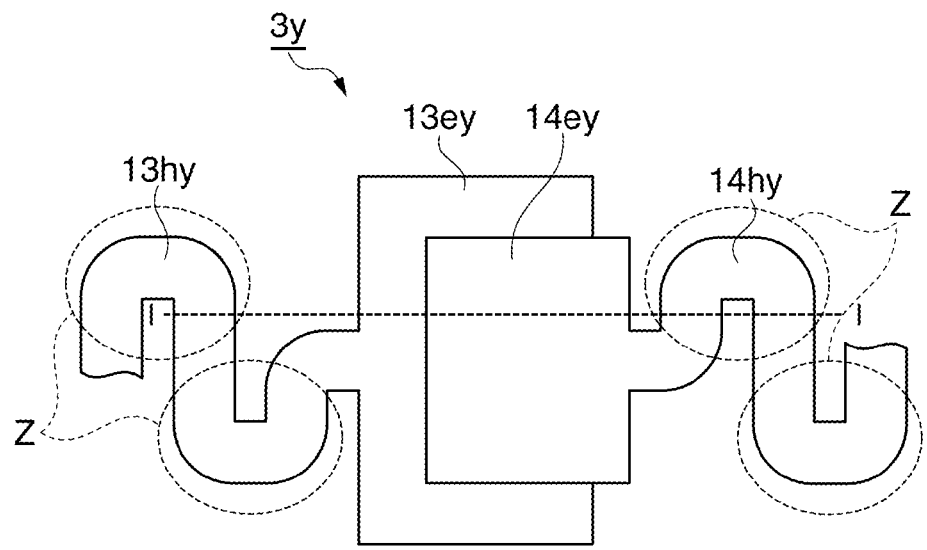
FIG. 5A is a plan view of a MEMS vibrator according to Embodiment 3.
Figure 5B:
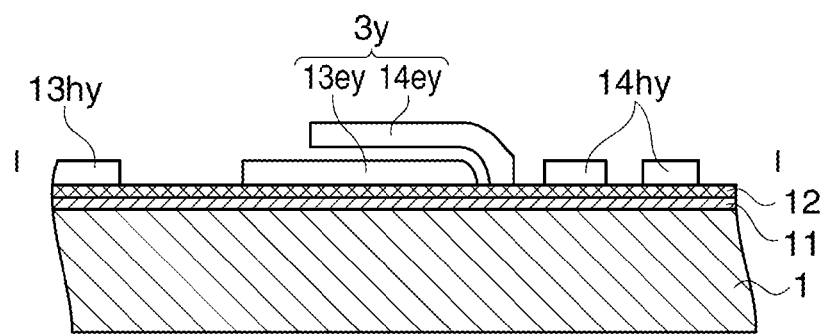
FIG. 5B is a cross-sectional view taken along the line I-I.

FIG. 5A is a plan view of a MEMS vibrator 3y included in the MEMS device 102 (not shown), and FIG. 5B is a cross-sectional view taken along the line I-I of FIG. 5A.

Embodiment 3 has a feature in which a lower electrode wire portion and an upper electrode wire portion are formed so as to include a curved section in the extending directions without having the anchor structure as in Embodiments 1 and 2.

The MEMS device 102 is a MEMS device having a MEMS vibrator 3y which includes a lower electrode 13ey and an upper electrode 14ey laminated and formed on the first foundation portion (the nitride film 12) which is laminated on the main surface of the wafer substrate 1. The lower electrode 13ey and the upper electrode 14ey have an overlapping region in plan view of the wafer substrate 1.

A lower electrode wire portion 13hy is laminated on the nitride film 12 and electrically connects the lower electrode 13ey to an external circuit (not shown). An upper electrode wire portion 14hy is laminated on the nitride film 12 and electrically connects the upper electrode 14ey to the external circuit. The lower electrode wire portion 13hy and the upper electrode wire portion 14hy are formed so as to include curved sections Z in the extending direction as shown in FIG. 5A.

In the MEMS device 102, there is no opening 50, and there is no anchor structure in which the lower electrode 13ey, the upper electrode 14ey, the lower electrode wire portion 13hy, and the upper electrode wire portion 14hy are respectively laminated on the first oxide film 11 via the openings 50. Alternatively, the lower electrode 13ey and the upper electrode 14ey are formed so as to include the curved sections Z in the extending direction. The MEMS device 102 is the same as the MEMS device 100 except for these matters.

According to the MEMS device of the present embodiment, even in a case where there is a remaining stress in the nitride film 12 on which the lower electrode wire portion 13$hy$ and the upper electrode wire portion 14$hy$ are laminated, the nitride film 12 expands or contacts due to a thermal stress, or the like, this stress is absorbed by the curved sections Z of the wires, and thus a ratio thereof acting on the lower electrode 13$ey$ or the upper electrode 14$ey$ is reduced. In other words, the stress of the nitride film 12 is alleviated which changes a positional relationship between the lower electrode 13$ey$ and the upper electrode 14$ey$. As a result, the resonance frequency characteristic of the MEMS vibrator 3$y$ is suppressed from changing. Therefore, a MEMS vibrator which is a MEMS structure with more stable characteristics can be obtained, and thus it is possible to provide a MEMS device with more stable characteristics.

Electronic Apparatus

Next, a description will be made of electronic apparatuses which employ the MEMS devices 100, 101 and 102 as electronic components according to an embodiment of the invention with reference to FIGS. 6A, 6B and 7. In addition, in the following description, the description will be made of an example of employing the MEMS device 100 as an electronic component.

Figure 6A:
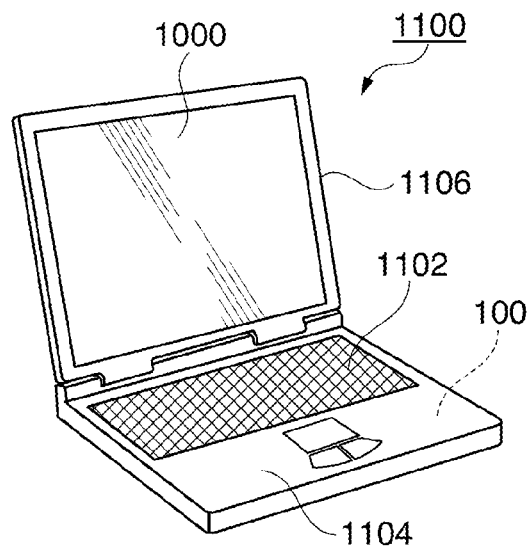
FIG. 6A is a perspective view illustrating a configuration of a mobile type personal computer as an example of an electronic apparatus.

FIG. 6A is a perspective view illustrating a schematic configuration of a mobile type (or a notebook type) personal computer which is an electronic apparatus including the electronic component according to the embodiment of the invention. In FIG. 6A, a personal computer 1100 includes a main body unit 1104 provided with a keyboard 1102 and a display unit 1106 provided with a display portion 1000, and the display unit 1106 is supported by the main body unit 1104 via a hinge structure portion so as to be rotatably moved. The MEMS device 100, which is an electronic component functioning as a filter, a resonator, a reference clock, and the like, is embedded in the personal computer 1100.

Figure 6B:
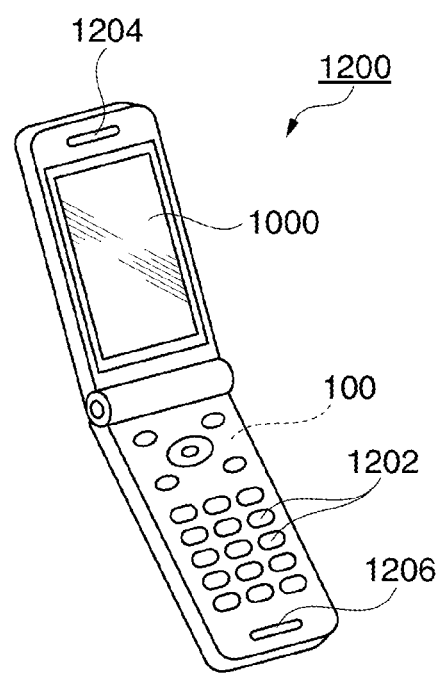
FIG. 6B is a perspective view illustrating a configuration of a mobile phone as an example of an electronic apparatus.

FIG. 6B is a perspective view illustrating a schematic configuration of a mobile phone (also including PHS) which is an electronic apparatus including the electronic component according to the embodiment of the invention. In FIG. 6B, a mobile phone 1200 includes a plurality of operation buttons 1202, an ear piece 1204, and a mouth piece 1206, and the display portion 1000 is disposed between the operation buttons 1202 and the ear piece 1204. The MEMS device 100, which is an electronic component (a timing device) functioning as a filter, a resonator, an angular velocity sensor, and the like, is embedded in the mobile phone 1200.

Figure 7:
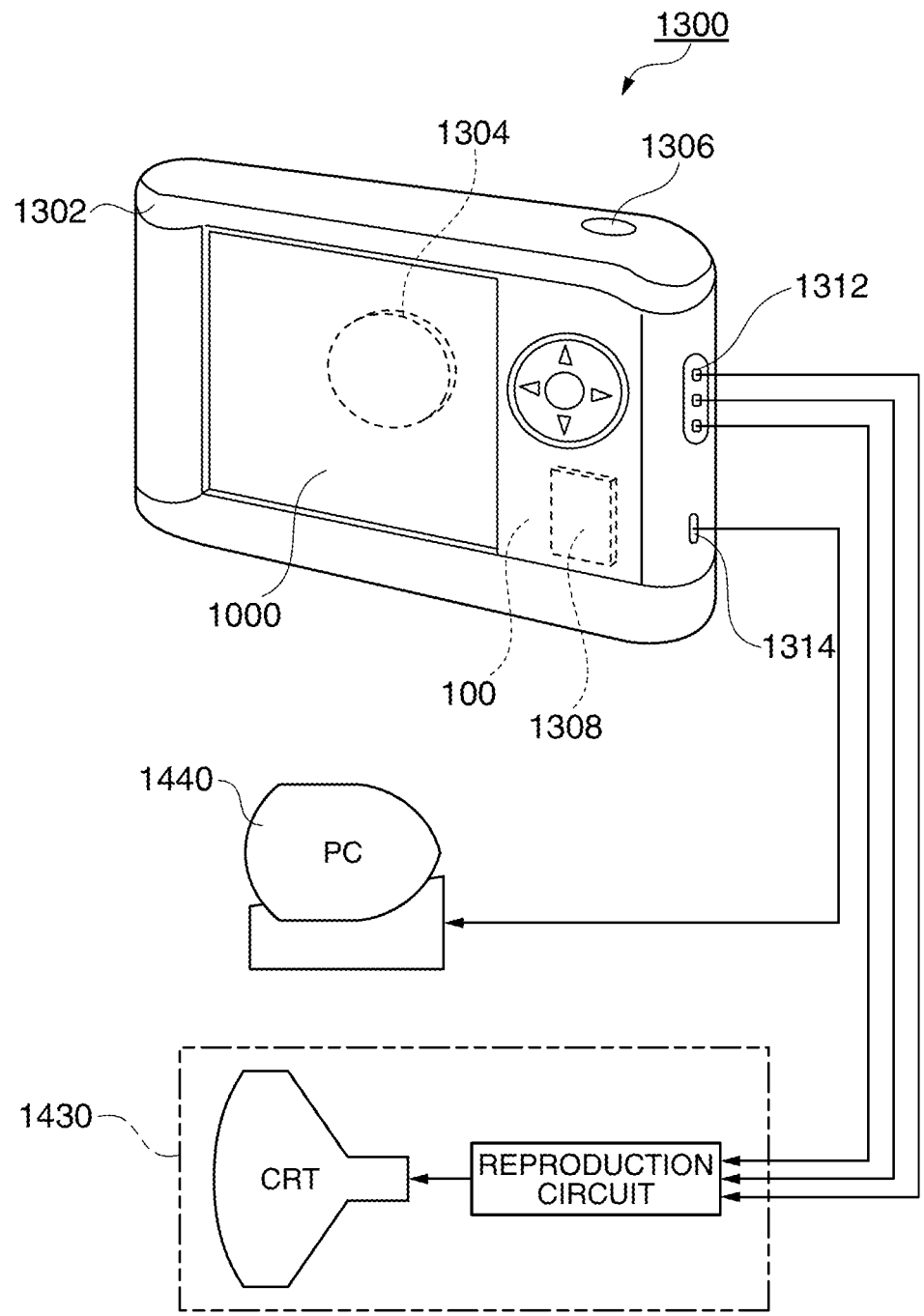
FIG. 7 is a perspective view illustrating a configuration of a digital still camera as an example of an electronic apparatus.

FIG. 7 is a perspective view illustrating a schematic configuration of a digital still camera which is an electronic apparatus including the electronic component according to the embodiment of the invention. In addition, in FIG. 7, connections to an external apparatus are simply shown. The digital still camera 1300 performs photoelectric conversion on a light image of a subject by using an imaging device such as a charge coupled device (CCD) so as to generate an imaging signal (an image signal).

A display portion 1000 is provided on a rear surface of a case (body) 1302 of the digital still camera 1300, and performs display based on an imaging signal generated by a CCD, and the display portion 1000 functions as a finder which displays a subject as an electronic image. In addition, alight sensing unit 1304 which includes an optical lens (imaging optical system), a CCD, and the like is provided on a front surface side (the other side of FIG. 7) of the case 1302.

When a photographer checks a subject image displayed on the display portion 1000 and pushes a shutter button 1306, an imaging signal of the CCD at that point is transferred to and is stored in a memory 1308. In addition, video signal output terminals 1312 and an input and output terminal 1314 for data communication are provided on the side surface of the case 1302 in the digital still camera 1300. In addition, as shown in FIG. 7, a television monitor 1430 is connected to the video signal output terminals 1312, and a personal computer 1440 is connected to the input and output terminal 1314 for data communication, as necessary. Further, the imaging signal stored in the memory 1308 is output to the television monitor 1430 or the personal computer 1440 through a predetermined operation. The MEMS device 100, which is an electronic component functioning as a filter, a resonator, an angular velocity sensor, and the like, is embedded in the digital still camera 1300.

Further, in addition to the personal computer (a mobile type personal computer) of FIG. 6A, the mobile phone of FIG. 6B, and the digital still camera of FIG. 7, the MEMS device 100 which is an electronic component according to an embodiment of the invention is applicable to, for example, an ink jet type ejection apparatus (for example, an ink jet printer), a laptop type personal computer, a television, a video camera, a car navigation apparatus, a pager, an electronic organizer (including a communication function portion), an electronic dictionary, an electronic calculator, an electronic gaming machine, a workstation, a videophone, a security television monitor, an electronic binocular, a POS terminal, a medical apparatus (for example, an electronic thermometer, a sphygmomanometer, a blood glucose monitoring system, an electrocardiographic apparatus, an ultrasonic diagnostic apparatus, or an electronic endoscope), a fish-finder, various measurement apparatuses, meters and gauges (for example, meters and gauges of vehicles, aircrafts, and ships), a flight simulator, and the like.

In addition, the invention is not limited to the above-described embodiments, and may add various modifications or alterations to the above-described embodiments. Modification examples will be described below. Here, the same constituent element as in the above-described embodiments is given the same reference numeral, and repeated description will be omitted.

Modification Example 1

Figure 8A:
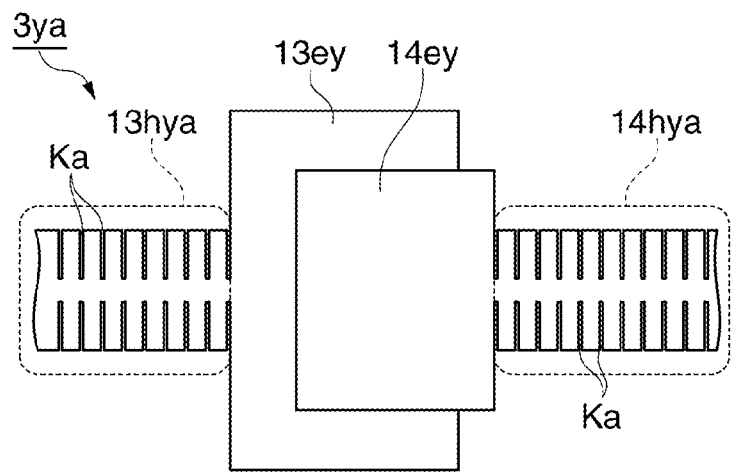
FIGS. 8A and 8B are plan views of MEMS vibrators according to modification examples.
Figure 8B:
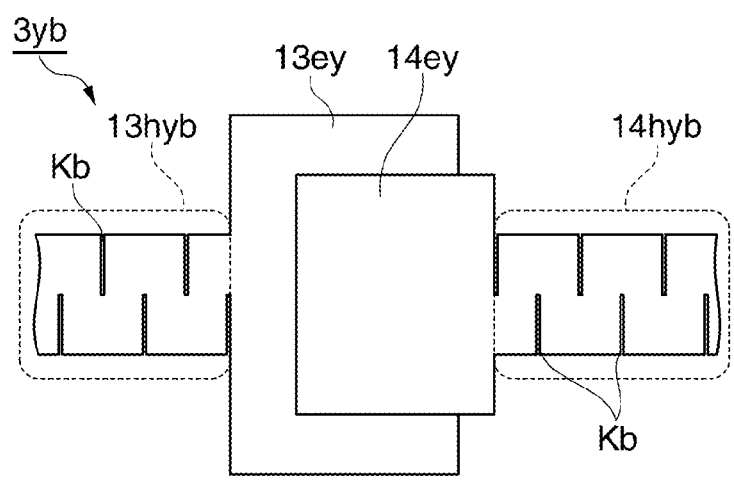

FIGS. 8A and 8B are plan views illustrating MEMS vibrators 3$ya$ and 3$yb$ according to modification examples of the MEMS device 102 of Embodiment 3.

Although a description has been made that, in the MEMS vibrator 3$y$ of the MEMS device 102, as shown in FIG. 5A, the lower electrode wire portion 13$hy$ and the upper electrode wire portion 14$hy$ are formed so as to include the curved sections Z in the extending direction, and thus the stress caused by the nitride film 12 is absorbed by the curved sections Z of the wires such that a ratio thereof acting on the lower electrode 13$ey$ or the upper electrode 14$ey$ is reduced, a method of reducing the stress by using a shape of the wire is not limited to this configuration. A MEMS vibrator according to the present modification example has a feature in which a lower electrode wire portion and an upper electrode wire portion respectively have notches formed in a direction perpendicular to the extending direction thereof.

The MEMS vibrators 3ya and 3yb include a lower electrode 13ey, an upper electrode 14ey, and lower electrode wire portions 13hya and 13hyb and upper electrode wire portions 14hya and 14hyb, respectively, as wire portions. The MEMS vibrators 3ya and 3yb are the same as the MEMS vibrator 3y except that a pattern shape of the wire portion is different.

The lower electrode wire portion 13hya and the upper electrode wire portion 14hya included in the MEMS vibrator 3ya respectively have a plurality of notches Ka formed in the direction perpendicular to the extending direction thereof.

The notches Ka are formed opposite to each other such that the notches with about ⅓ of the width of the lower electrode wire portion 13hya and the upper electrode wire portion 14hya are directed toward the center of the wire pattern from the lateral side of the wire pattern through patterning using photolithography on the first semiconductor layer 13 and the second semiconductor layer 14. In other words, when compared, the lower electrode wire portion 13hya and the upper electrode wire portion 14hya are patterned in a fish-bone shape.

The lower electrode wire portion 13hyb and the upper electrode wire portion 14hyb included in the MEMS vibrator 3yb respectively have a plurality of notches Kb formed in the direction perpendicular to the extending direction thereof.

The notches Kb are alternately formed such that the notches with about ½ of the width of the lower electrode wire portion 13hyb and the upper electrode wire portion 14hyb are directed toward the center of the wire pattern from the lateral side of the wire pattern through patterning using photolithography on the first semiconductor layer 13 and the second semiconductor layer 14. In other words, when compared, the lower electrode wire portion 13hyb and the upper electrode wire portion 14hyb are patterned in a bellows shape.

As in these modification examples, even in a case where a stress caused by the laminated nitride film 12 acts on each of the wire portions, the stress is absorbed by the notches Ka and Kb parts formed in each of the wire portions and thus a ratio thereof acting on the fixed lower electrode (the lower electrode 13ey) or the movable upper electrode (the upper electrode 14ey) is reduced. In other words, the stress of the nitride film 12 which changes a positional relationship between the fixed lower electrode and the movable upper electrode is reduced. As a result, the resonance frequency characteristic of the MEMS vibrators 3ya and 3yb is suppressed from changing. Therefore, a MEMS vibrator which is a MEMS structure with more stable characteristics can be obtained, and thus it is possible to provide a MEMS device with more stable characteristics.

The entire disclosure of Japanese Patent Application No. 2012-172611, filed Aug. 3, 2012 is expressly incorporated by reference herein.

What is claimed is:

1. A MEMS device comprising:
a fixed lower electrode that is disposed above a substrate;
a movable upper electrode that has a region which overlaps the fixed lower electrode in plan view of the substrate;
a lower electrode wire portion that is disposed above the substrate and electrically connects the fixed lower electrode to an external circuit; and
an upper electrode wire portion that is disposed above the substrate and electrically connects the movable upper electrode to the external circuit, wherein the lower electrode wire portion and the upper electrode wire portion have notch sections in a direction intersecting an extending direction thereof.

2. An electronic apparatus comprising:
the MEMS device according to claim 1.

* * * * *